United States Patent
Sah et al.

(10) Patent No.: US 10,599,248 B2
(45) Date of Patent: Mar. 24, 2020

(54) TOUCH INPUT DEVICE

(71) Applicant: Hyundai Motor Company, Seoul (KR)

(72) Inventors: Sung Jin Sah, Suwon-si (KR); Kwang Myung Oh, Suwon-si (KR); Sung Min Park, Seoul (KR)

(73) Assignee: Hyundai Motor Company, Seoul (KR)

( * ) Notice: Subject to any disclaimer, the term of this patent is extended or adjusted under 35 U.S.C. 154(b) by 170 days.

(21) Appl. No.: 15/374,283

(22) Filed: Dec. 9, 2016

(65) Prior Publication Data

US 2018/0095578 A1 Apr. 5, 2018

(30) Foreign Application Priority Data

Oct. 4, 2016 (KR) ........................ 10-2016-0127653

(51) Int. Cl.
| | | |
|---|---|---|
| *G06F 3/041* | (2006.01) | |
| *H03K 17/965* | (2006.01) | |
| *G06F 3/0354* | (2013.01) | |
| *H03K 17/96* | (2006.01) | |

(52) U.S. Cl.
CPC ........ *G06F 3/0414* (2013.01); *G06F 3/03547* (2013.01); *G06F 3/041* (2013.01); *H03K 17/96* (2013.01); *H03K 17/965* (2013.01); *G06F 2203/04104* (2013.01); *G06F 2203/04105* (2013.01)

(58) Field of Classification Search
CPC ........ G06F 3/0414; G06F 2203/04104; H03K 17/965; H03K 17/96
See application file for complete search history.

(56) References Cited

U.S. PATENT DOCUMENTS

| | | | |
|---|---|---|---|
| 4,121,049 A | 10/1978 | Roeber | |
| 5,038,142 A | 8/1991 | Flowers et al. | |
| 5,447,074 A * | 9/1995 | Polaert | G01G 3/1402 73/763 |
| 10,019,085 B2 * | 7/2018 | Qiao | G06F 3/041 |
| 2007/0229464 A1 * | 10/2007 | Hotelling | G06F 3/0414 345/173 |
| 2010/0277439 A1 * | 11/2010 | Charlier | G06F 1/1616 345/176 |
| 2011/0012921 A1 * | 1/2011 | Cholewin | G06F 1/1626 345/619 |
| 2013/0100036 A1 | 4/2013 | Papakipos et al. | |
| 2013/0342501 A1 | 12/2013 | Mölne et al. | |
| 2014/0098075 A1 * | 4/2014 | Kwak | G06F 3/0487 345/204 |

FOREIGN PATENT DOCUMENTS

| | | | |
|---|---|---|---|
| JP | 2015064749 A | 4/2015 | |
| JP | 2015200939 A | 11/2015 | |
| KR | 20140024038 A | 2/2014 | |
| KR | 20160014187 A | 2/2016 | |

* cited by examiner

*Primary Examiner* — Jonathan A Boyd
(74) *Attorney, Agent, or Firm* — Slater Matsil, LLP

(57) ABSTRACT

The present disclosure relates to a touch input device. The touch input device includes a first touch sensing member which is provided with a first touch surface. A second touch sensing member is disposed across the first touch sensing member, and is provided with a second touch surface that is located on the opposite side of the first touch sensing member. A suspension is provided to be deformable in response to a touch direction when a touch is applied to one of the first touch sensing member and the second touch sensing member. A force sensor is provided in the suspension.

17 Claims, 15 Drawing Sheets

TOUCH INPUT DEVICE

CROSS-REFERENCE TO RELATED APPLICATIONS

This application claims the benefit of priority to Korean Patent Application No. 10-2016-0127653, filed on Oct. 4, 2016 in the Korean Intellectual Property Office, the disclosure of which is incorporated herein in its entirety by reference.

TECHNICAL FIELD

The present disclosure relates to a touch input device, and more particularly, to a touch input device which can easily recognize a touch on two touch surfaces located opposite to each other.

BACKGROUND

A touch input device (e.g., a touch screen or a touch pad) can be implemented to sense a touch of a pointing object (user's finger, a stylus tip, etc.), and determine the characteristic (intensity of force, touch position, direction of movement, etc.) of the touch.

The touch input device may include various types of device such as a resistive-based touch input device, a capacitance-based touch input device, a force-based touch input device, an infrared-based touch input device, a surface acoustic wave-based touch input device, and the like.

The touch input device may be applied to various fields such as a computer display device, an automated teller machine, a mobile terminal, a touch pad of notebook PC, a touch input unit for vehicle, and the like.

Meanwhile, since a conventional touch input device is configured to input a touch gesture on a single touch surface, there is a low usability of the touch input.

SUMMARY

The present disclosure has been made in view of the above problems, and provides a touch input device that enables to easily recognize a touch for two touch surfaces located on the opposite side to implement a double-sided touch input structure effectively.

In accordance with an aspect of the present disclosure, a touch input device includes a first touch sensing member which is provided with a first touch surface. A second touch sensing member is disposed across the first touch sensing member, and is provided with a second touch surface that is located on the opposite side of the first touch sensing member. A suspension is provided to be deformable in response to a touch direction when a touch is applied to one of the first touch sensing member and the second touch sensing member, and a force sensor is provided in the suspension.

The suspension is bent toward the second touch sensing member when the first touch sensing member is touched, and the suspension is bent toward the first touch sensing member when the second touch sensing member is touched. The suspension is a plate spring which has a long length in comparison with a thickness. At least a portion of the suspension is supported by the first and second touch sensing members, and the other side of the suspension is fixed to a frame. The force sensor outputs a signal individually according to a bending direction of the suspension. The suspension is provided with a moving portion which moves by a selective touch for the first touch sensing member and the second touch sensing member, a fixing portion which is spaced apart for the moving portion at regular distance, and a deformation portion which is disposed between the moving portion and the fixing portion. The force sensor is provided in the deformation portion.

BRIEF DESCRIPTION OF THE DRAWINGS

The objects, features and advantages of the present disclosure will be more apparent from the following detailed description in conjunction with the accompanying drawings, in which.

DETAILED DESCRIPTION OF ILLUSTRATIVE EMBODIMENTS

Exemplary embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

Figure 1:
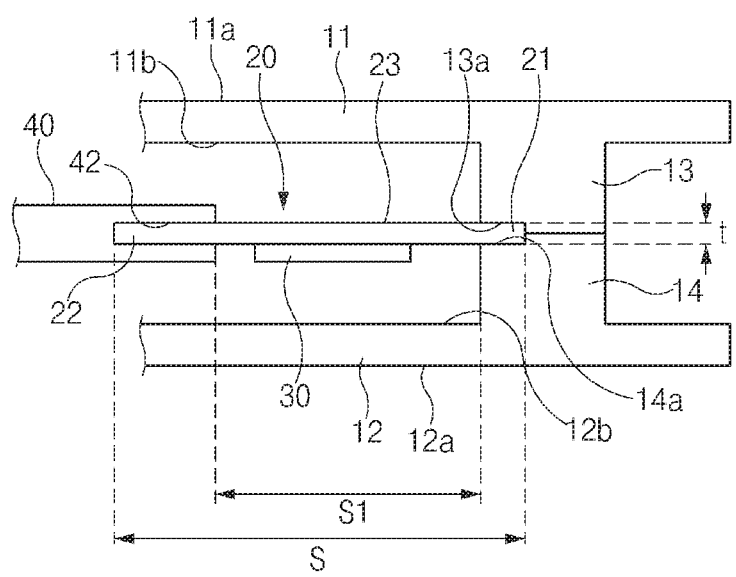
FIG. 1 is a partial cross-sectional side view illustrating a touch input device according to various embodiments of the present disclosure.

Referring to FIG. 1, a touch input device according to an embodiment of the present disclosure may include a first touch sensing member 11, and a second touch sensing member 12 disposed spaced apart for the first touch sensing member 11.

The first touch sensing member 11 may include a first touch surface 11a on which a pointing object (user's finger, stylus tip, etc.) is touched and a first rear side 11b formed in the opposite side of the first touch surface 11a, and the first touch surface 11a may be formed flatly or at least a portion may be formed to be bent in part.

The first touch sensing member 11 may be formed of a structure having sufficient rigidity so that local deformation may be hardly generated by the touch applied to the first touch surface 11a. According to an example, a separate stiffener such as metal foam may be provided in the first rear side 11b of the first touch sensing member 11.

A second touch sensing member 12 may be disposed across the first touch sensing member 11. The second touch sensing member 12 may include a second touch surface 12a on which a pointing object is touched and a second rear side 12b formed in the opposite side of the second touch surface 12a. The second touch surface 12a may be located on the opposite side of the first touch surface 11a, and the second rear side 12b and the first rear side 11b may be located to face each other.

The second touch sensing member 12 may be formed of a structure having a sufficient rigidity so that local deformation may be hardly generated by the touch applied to the second touch surface 12a. According to an example, a separate stiffener such as metal foam may be provided in the second rear side 12b of the second touch sensing member 12.

Figure 14:
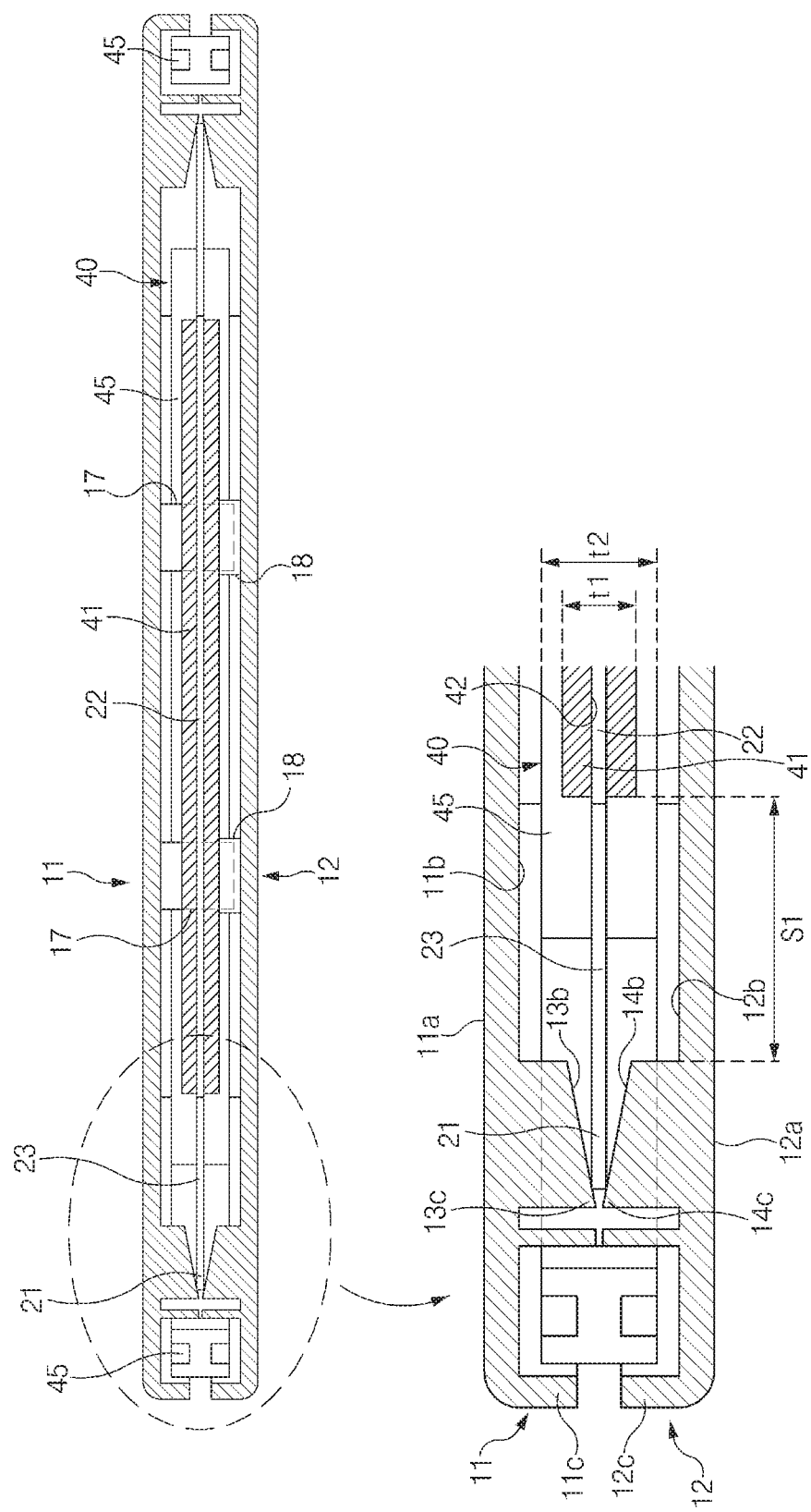
FIG. 14 is a cross-sectional view shown along a line A-A of FIG. 11.

The first touch sensing member 11 and the second touch sensing member 12 may be combined to be firmly bound to each other(refer to a first and a second combination parts 17, 18 of FIG. 14). Through this, when a touch is applied to the first touch sensing member 11 or the second touch sensing member 12, a relative movement may be prevented between the first touch sensing member 11 and the second touch sensing member 12, and thus, the first touch sensing member 11 and the second touch sensing member 12 may be moved together in the same direction.

A suspension 20 may be connected to the first touch sensing member 11 and the second touch sensing member 12. The suspension 20 may be configured to be minutely deformed in response to the touch direction when a touch is applied to the first touch sensing member 11 or the second touch sensing member 12.

According to one embodiment, the suspension 20 may be configured to be minutely bent in response to the touch of the first touch sensing member 11 or the second touch sensing member 12.

The suspension 20 may be formed of elastic material that has a low rigidity in comparison with the first and second touch sensing members 11 and 12, and thus, the minute bending (deformation) of the suspension 20 may be easily accomplished when a touch is applied to the first touch sensing member 11 or the second touch sensing member 12. Furthermore, local deformation of the first and second touch sensing members 11 and 12 may be prevented.

In particular, at least a portion of the suspension 20 may be supported by the first touch sensing member 11 and the second touch sensing member 12, and the other side of the suspension 20 may be fixed to a frame 40. Thus, the suspension 20 may be provided to support the first touch sensing member 11 and the second touch sensing member 12 elastically.

The suspension 20 may be formed of elastic material, and the suspension 20 may be, for example, a plate spring which has a long length S in comparison with a thickness.

Thus, as the suspension 20 is formed of elastic material, when a touch is applied on the first touch surface 11a of the first touch sensing member 11 or the second touch surface 12a of the second touch sensing member 12, the bending (deformation) of the suspension 20 may be easily accomplished in the direction to which touch is applied. Then, when the force by the touch is removed, each touch sensing member 11, 12 may be easily returned to its original position by the elastic force of the suspension 20.

The suspension 20 may be provided with one or more force sensors 30, and the force sensor 30 may be provided in a portion in which the deformation of the suspension 20 according to the touch is generated, thereby precisely sensing the position of touch, the intensity of touch, the movement direction of touch, and the like.

The force sensor 30 may sense a force (normal load) in response to the bending (deforming) direction of the suspension 20, and thus the force sensor 30 may output a 12. separately according to the bending direction of the suspension 20.

Figure 2:
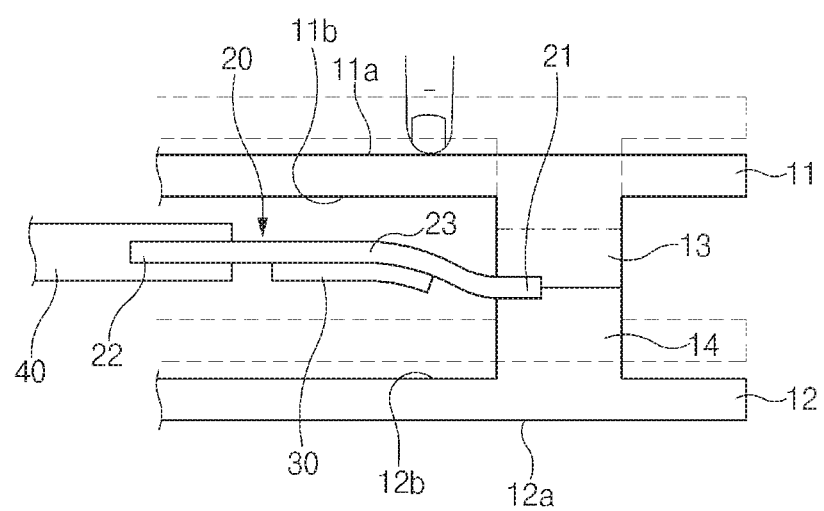
FIG. 2 is a diagram illustrating a state in which a first touch surface of a touch input device of FIG. 1 is touched.

As illustrated in FIG. 2, when the first touch surface 11a of the first touch sensing member 11 is touched, the suspension 20 may be bent downwardly as the first touch sensing member 11 and the second touch sensing member 12 moves to the lower portion due to a touch. The force sensor 30 may output a signal corresponding to the bending direction (bent in the lower direction in FIG. 2) of the suspension 20, for example, a positive (+) signal.

Figure 3:
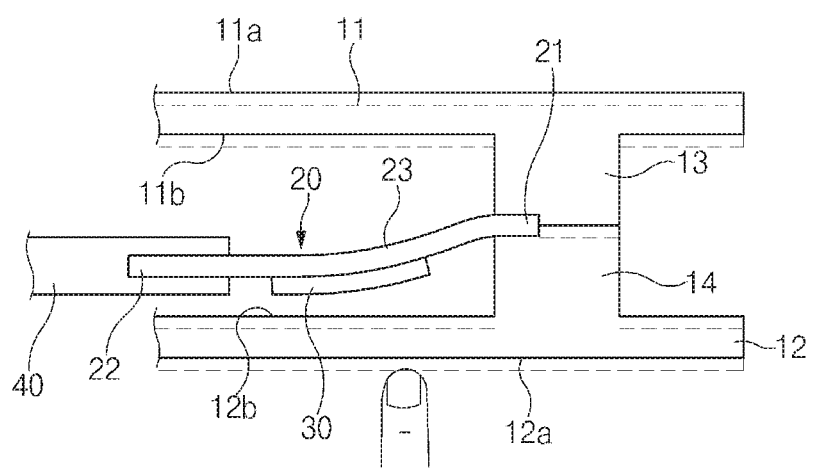
FIG. 3 is a diagram illustrating a state in which a second touch surface of a touch input device of FIG. 1 is touched.

As illustrated in FIG. 3, when the second touch surface 12a of the second touch sensing member 12 is touched, the suspension 20 may be bent downwardly as the second touch sensing member 12 and the first touch sensing member 11 moves to the upper portion due to a touch. The force sensor 30 may output a signal corresponding to the bending direction (bent in the upper direction in FIG. 2) of the suspension 20, for example, a negative (−) signal.

According to one embodiment, the force sensor 30 may be a strain gauge. The strain gage may be connected to a bridge circuit (e.g., half bridge, full-bridge, etc.) and may be configured to convert the change of resistance value due to the bending (deformation) of the suspension 20 into a minute voltage and thus calculate amount of change. Then, the force sensor 30 may accurately sense the strength of power, the touch position, the movement direction of touch, and the like in response to the bending of the suspension 20.

The suspension 20 may be provided with a moving portion 21 which moves up and down by the touch of the first touch sensing member 11 or the second touch sensing member 12 and a fixing portion 22 which is spaced apart for the moving portion 21 at regular distance. Thus, the suspension 20 may be bent up and down as the moving portion 21 moves up and down based on the fixing portion 22.

The moving portion 21 may be interposed between the first touch sensing member 11 and the second touch sensing member 12 and may be supported or coupled to the first and second touch sensing members 11, 12. Thus, the moving portion 21 may move together with the first and second touch sensing members 11, 12 by a touch in the same direction.

The fixing portion 22 may be fixed to the frame 40, and the fixing portion 22 may be spaced apart for the moving portion 21 at regular distance S1. The distance S1 between the moving portion 21 and the fixing portion 22 may have a length enough to facilitate the bending (deformation) of the suspension 20.

The frame 40 may be disposed not to interfere with the movement of the first and second touch sensing members 11, 12. According to one example, as shown in FIG. 1 to FIG. 3, the frame 40 may be disposed between the first touch sensing member 11 and the second touch sensing member 12.

Thus, as the first touch sensing member 11 and the second moving portion 21 are selectively touched, the moving portion 21 of the suspension 20 may be moved downward or upward such that a deformation portion 23 of the suspension 20 may be bent downward or upward. That is, a bidirectional bending of the suspension 20 may be easily achieved. In addition, the fixing portion 22 of the suspension 20 may be fixed to the frame 40 such that the suspension 20 may be able to support the frame 40 stably.

As illustrated in FIG. 1 to FIG. 3, the moving portion 21 may be formed in at least one end of the suspension 20, and the moving portion 21 may be provided to be supported or coupled between the first touch sensing member 11 and the second touch sensing member 12.

According to the embodiments of FIG. 1 to FIG. 3, a first projection 13 may be formed in the first rear side 11b of the first touch sensing member 11, and a second projection 14 may be formed in the second rear side 12b of the second touch sensing member 12. The first projection 13 and the second projection 14 may be formed in a location correspond to each other. The first projection 13 and the second projection 14 may be combined through an adhesive, a fastener, or the like.

According to one example, the moving portion 21 of the suspension 20 may be supported by the first protrusion 13 of the first touch sensing member 11 and the second projection 14 of the second touch sensing member 12.

A first groove 13a may be formed in the first projection 13 and a second groove 14a may be formed in the second projection 14. The first groove 13a and the second groove 14a may be formed in a shape corresponding to the moving portion 21 of the suspension 20. Thus, the moving portion 21 of the suspension 20 may be inserted and supported into the first groove 13a of the first projection 13 and the second groove 14a of the second projection 14 or may be fixed through a fastener, an adhesive, or the like. In addition, the first groove 13a and the second groove 14a may be formed of a shape symmetrical with each other.

The frame 40 may be provided with a fixing groove 42, and the fixing portion 22 of the suspension 20 may be inserted into the fixing groove 42 of the frame 40 and combined through an adhesive or the like.

Thus, as the suspension 20 may be bent (deformed) through a selective touch for the first touch surface 11a of the first touch sensing member 11 and the second touch surface 12a of the second touch sensing member 12, the force sensor provided in the suspension 20 may output an individual signal (e.g., (+) signal and (−) signal) corresponding to the bending direction, such that the present disclosure may effectively implement the double-sided touch input structure.

According to one example, the first touch sensing member 11 and the second touch sensing member 12 may have the same shape, size, weight and the like, and thus, may be disposed symmetrically based on the suspension 20.

Figure 4:
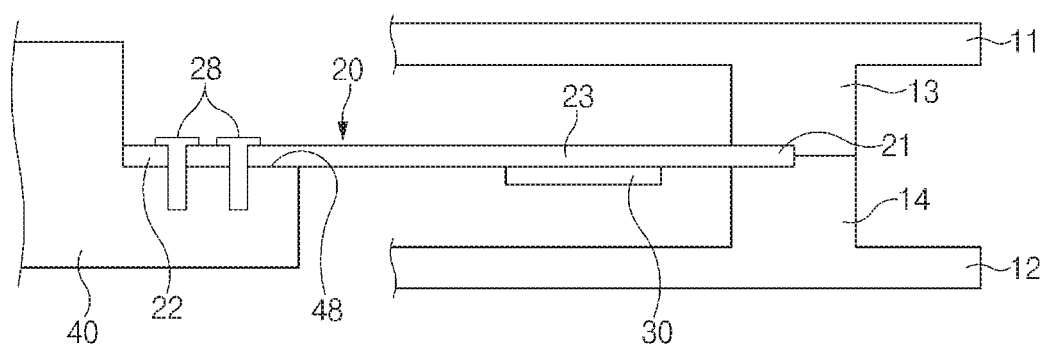
FIG. 4 is a partial cross-sectional side view illustrating a touch input device according to another embodiment of the present disclosure.

According to the embodiment of FIG. 4, a mounting seat 48 may be formed in one side of the frame 40, and the fixing portion 22 of the suspension 20 may be combined with the mounting seat 48 through a fastener 28.

Figure 5:
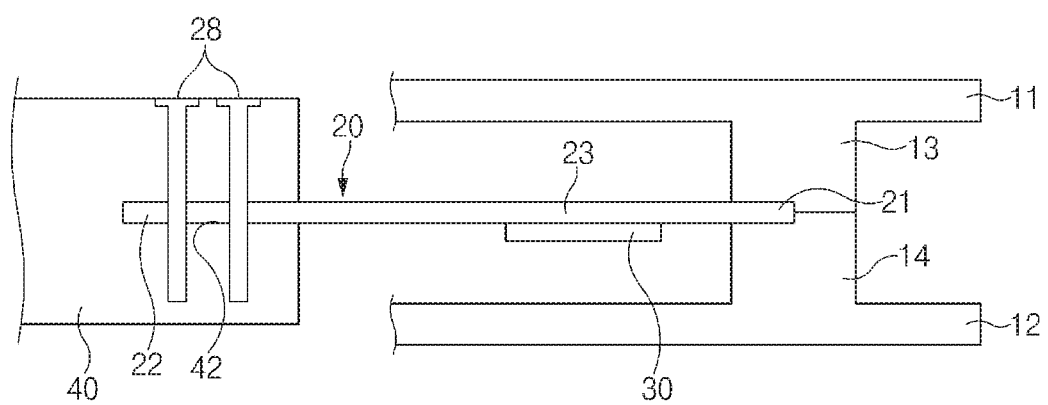
FIG. 5 is a partial cross-sectional side view illustrating a touch input device according to another embodiment of the present disclosure.

According to the embodiment of FIG. 5, the fixing portion 22 of the suspension 20 may be inserted into the fixing groove 42 of the frame 40, and at least one fastener 28 may be fastened by penetrating the fixing portion 22 of the suspension 20.

Figure 6:
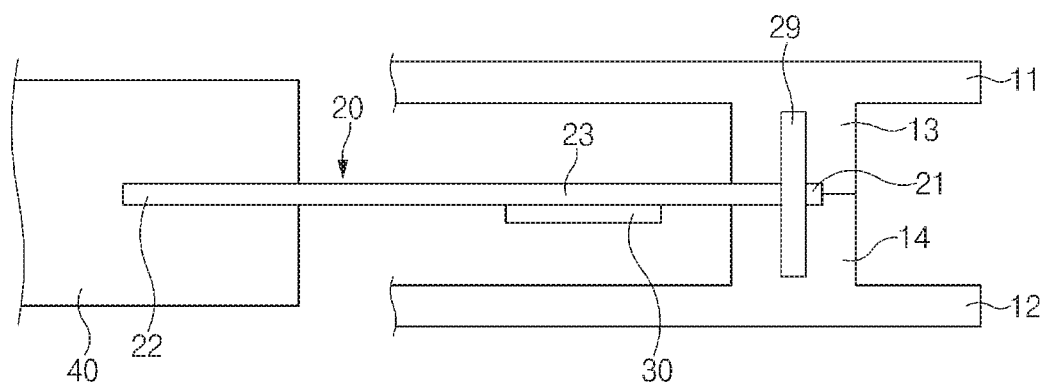
FIG. 6 is a partial cross-sectional side view illustrating a touch input device according to another embodiment of the present disclosure.

According to the embodiment of FIG. 6, the moving portion 21 of the suspension 20 may be combined via a combination piece 29 while being interposed between the first projection 13 of the first touch sensing member 11 and the second projection 14 of the second touch sensing member 12.

Figure 7:
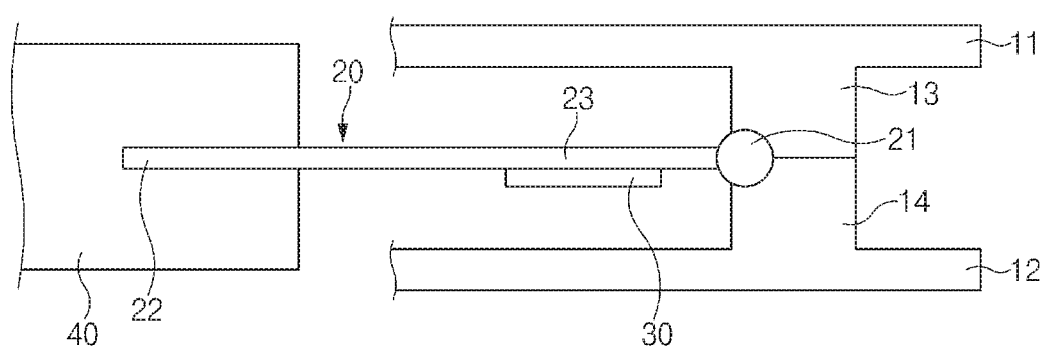
FIG. 7 is a partial cross-sectional side view illustrating a touch input device according to another embodiment of the present disclosure.

According to the embodiment of FIG. 7, the moving portion 21 of the suspension 20 may be formed of a hinge structure provided between the first projection 13 of the first touch sensing member 11 and the second projection 14 of the second touch sensing member 12. The moving portion 21 may be pivotably mounted between the first projection 13 of the first touch sensing member 11 and the second projection 14 of the second touch sensing member 12 by such a hinge structure. The bending (deformation) of the suspension 20 may be achieved smoothly when the first and second touch sensing members 11, 12 are touched as the moving portion 21 is pivotably mounted in the first and second touch sensing members 11 and 12.

Figure 8:
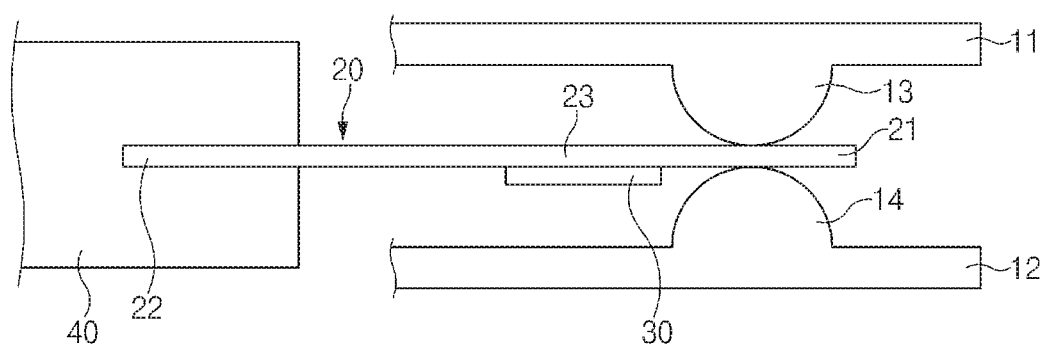
FIG. 8 is a partial cross-sectional side view illustrating a touch input device according to another embodiment of the present disclosure.

According to the embodiment of FIG. 8, the first projection 13 of the first touch sensing member 11 and the second projection 14 of the second touch sensing member 12 may be formed of a curved structure, and the first projection 13 and the second projection 14 may be configured to support the moving portion 21 of the suspension 20 while the first projection 13 and the second projection 14 are in contact with the moving portion 21 symmetrically in the upper and lower portions. Thus, as the moving portion 21 of the suspension 20 is supported while being in contact with the first projection 13 and the second projection 14, the bending (deformation) of the suspension 20 may be achieved smoothly.

Figure 9:
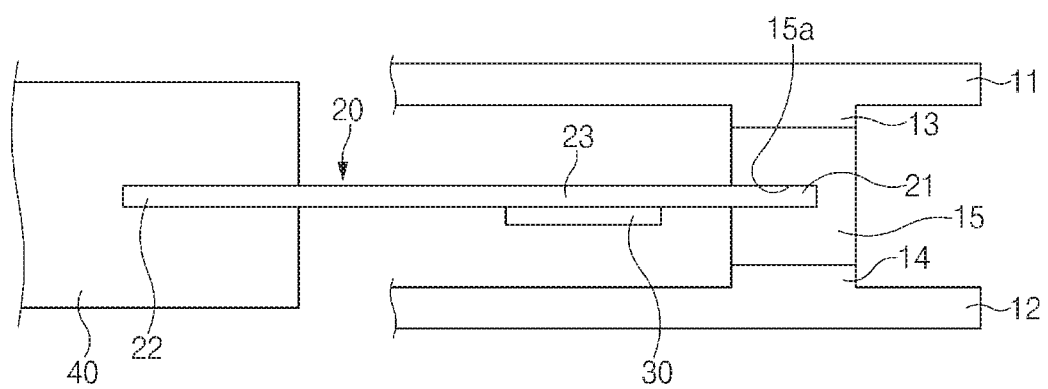
FIG. 9 is a partial cross-sectional side view illustrating a touch input device according to another embodiment of the present disclosure.

According to the embodiment of FIG. 9, an elastic member 15 may be interposed between the first projection 13 of the first touch sensing member 11 and the second projection 14 of the second touch sensing member 12, and the elastic member 15 may be provided with a fixing groove 15a. The moving portion 21 of the suspension 20 may be inserted and combined with the fixing groove 15a of the elastic member 15. Thus, the bending (deformation) of the suspension 20 may be achieved smoothly due to the deformation of the elastic member 15 when the first touch sensing member 11 and the second touch sensing member 12 are touched.

The touch input device according to various embodiments of the present disclosure may further include one or more stoppers 51, 52 which restrict the movement of the first and second touch sensing members 11, 12.

Figure 10:
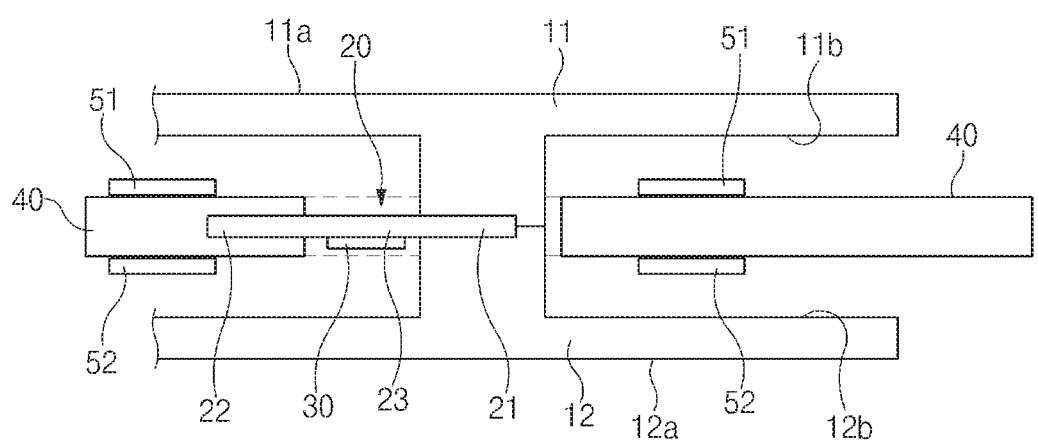
FIG. 10 is a partial cross-sectional side view illustrating a touch input device according to another embodiment of the present disclosure.
Figure 11:
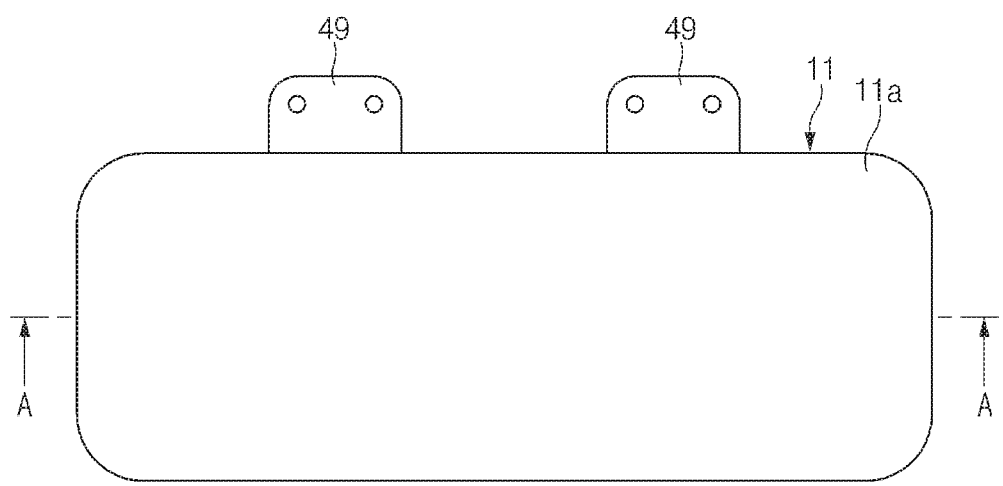
FIG. 11 is a plan view illustrating a first touch sensing member of a touch input device according to another embodiment of the present disclosure.

According to the embodiment of FIG. 10, a first stopper 51 may be provided in a top surface of the frame 40, and thus, the first stopper 51 may be able to be in contact with the first rear side 11b of the first touch sensing member 11 to restrict the movement of the first touch sensing member 11. A second stopper 52 may be provided in a bottom surface of the frame 40, and thus, the second stopper 52 may be in contact with the second rear side 12b of the second touch sensing member 12 to restrict the movement of the second touch sensing member 12.

Alternatively, the first stopper 51 may be provided in the first rear side 11b of the first touch sensing member 11, and thus, the first stopper 51 may be able to be in contact with top surface of the frame 40 to restrict the movement of the first touch sensing member 11. The second stopper 52 may be provided in the second rear side 12b of the second touch sensing member 12, and thus, the second stopper 51 may be able to be in contact with bottom surface of the frame 40 to restrict the movement of the second touch sensing member 12.

FIG. 11 to FIG. 14 are a diagram illustrating a touch input device according to embodiments of the present disclosure.

Referring to FIG. 11 to FIG. 14, the touch input device according to embodiments of the present disclosure may include the first touch sensing member 11, the second touch sensing member 12 which is disposed across the first touch sensing member 11, the suspension 20 which is provided deformably between the first touch sensing member 11 and the second touch sensing member 12, a plurality of force sensors 30 which are provided in the suspension 20, and the frame 40 which fixes(supports) at least a portion of the suspension 20.

The first touch sensing member 11 may be provided with the first touch surface 11a and the first rear side 11b, and a side wall 11c in the edge of the first touch sensing member 11 may be extended toward the second touch sensing member 12 to form a cover shape. The second touch sensing member 12 may be disposed across the first touch sensing member 11 to face each other. The second touch sensing member 12 may be provided with the second touch surface 12a and the second rear side 12b, and a side wall 12c in the edge of the second touch sensing member 12 may be extended toward the first touch sensing member 11 to form a cover shape.

Figure 15:
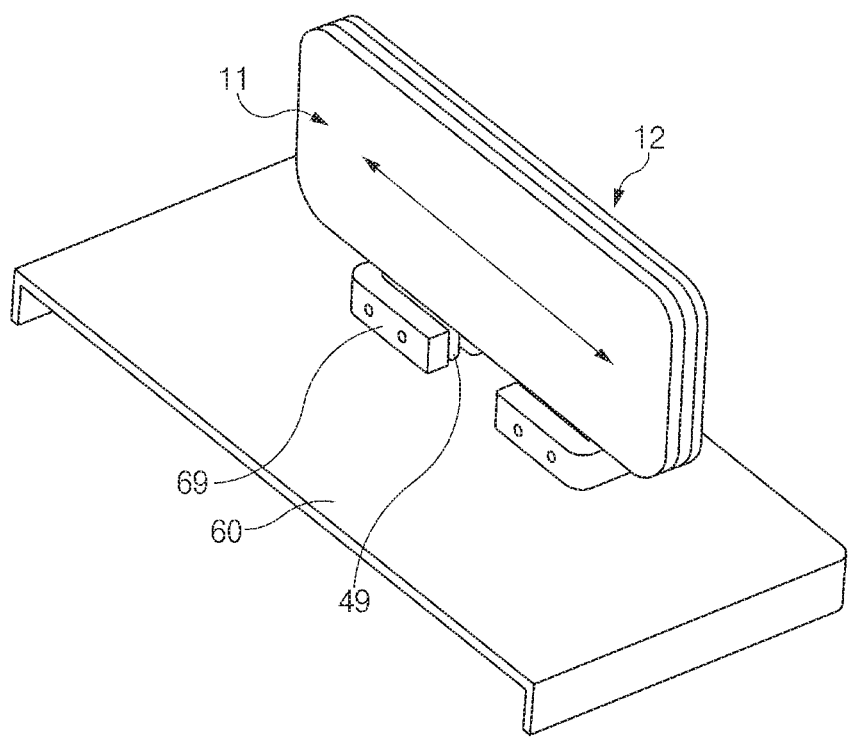
FIG. 15 is a perspective view illustrating a state in which the touch input device of FIG. 11 is provided.

According to one embodiment, the first touch sensing member 11 and the second touch sensing member 12 it may be formed of a symmetrical cover shape. Thus, the first side wall 11c of the first touch sensing member 11 and the second side wall 12c of the second touch sensing member 12 may be disposed to face each other. In particular, the first side wall 11c and the second side wall 12c may be in contact with each other or may be spaced apart by a fine gap. Thus, an inner space between the first touch sensing member 11 and the second touch sensing member 12 may be covered appropriately. Accordingly, as shown in FIG. 15, the external design may be kept beautifully by minimizing the outside exposure of the suspension 20 and the frame 40 provided between the first touch sensing member 11 and the second touch sensing member 12.

In the first rear side 11b of the first touch sensing member 11, one or more first projections 13 may be protruded toward the second touch sensing member 12. A first inclined surface 13b may be formed to be inclined in one direction in the bottom surface of the first projection 13, and thus, a first cutting edge portion 13c may be formed in one side of the first inclined surface 13b. In the second rear side 12b of the second touch sensing member 12, one or more second projections 14 may be protruded toward the first touch sensing member 11. A second inclined surface 14b may be formed to be inclined in one direction in the top surface of the second projection 14, and thus, a second cutting edge portion 14c may be formed in one side of the second inclined surface 14b. The first cutting edge portion 13c of the first inclined surface 13b and the second cutting edge portion 14c of the second inclined surface 14b may be disposed to be in contact with each other or to be close to each other.

The first touch sensing member 11 and the second touch sensing member 12 may be, as illustrated in FIG. 14, firmly combined to each other through a first combination portion 17 and a second combination portion 18 while maintaining a certain distance, and thus, the first touch sensing member 11 and the second touch sensing member 12 may be firmly bound to each other. Accordingly, both of the first touch sensing member 11 and the second first touch sensing member 12 may move in the same direction when the first touch sensing member 11 and the second first touch sensing member 12 are selectively touched.

The first combination portion 17 may be protruded toward the second touch sensing member 12 in the first rear side 11b of the first touch sensing member 11, and the second combination portion 18 may be protruded toward the first touch sensing member 11 in the second rear side 12b of the second touch sensing member 12. According to one example, as illustrated in FIG. 14, the first combination portion 17 may be formed of an engagement projection shape and the second combination portion 18 may be formed of a coupling boss shape. The first touch sensing member 11 and the second touch sensing member 12 may be combined to each other while maintaining a certain distance as the first combination portion 17 of engagement projection shape is inserted and combined into the second combination portion 18 of coupling boss shape.

Similarly to the above mentioned embodiments, the suspension 20 may be a plate spring which has a long length in comparison with a thickness. The suspension 20 may be provided with the moving portion 21 which moves together with the first and second touch sensing members 11, 12 and the fixing portion 22 fixed to the frame 40.

Figure 12:
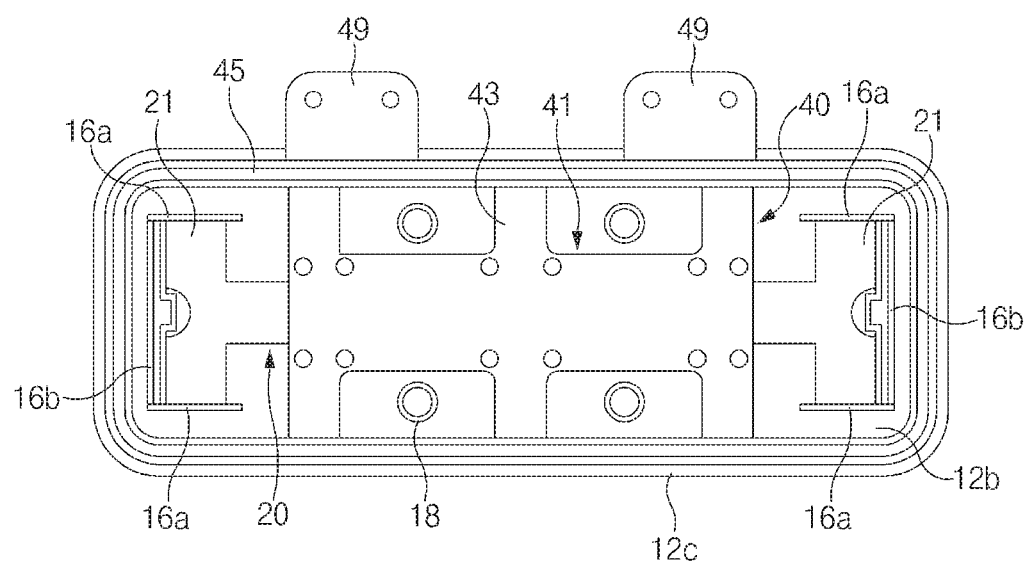
FIG. 12 is a diagram illustrating a state in which the first touch sensing member is omitted from the touch input device of FIG. 11.
Figure 13:
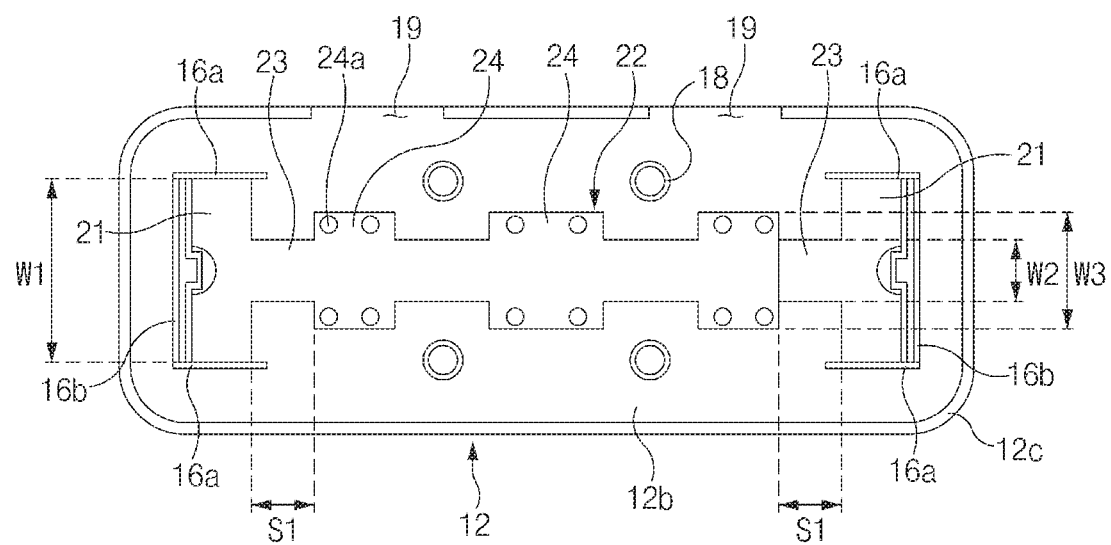
FIG. 13 is a diagram illustrating a state in which a frame is omitted from the touch input device of FIG. 11.

As shown in FIGS. 12 to 14, the suspension 20 may be provided with two moving parts 21 formed on both end portions in the longitudinal direction, the fixing portion 22 disposed between the two moving parts 21, and two deformation portion 23 disposed between the moving portion 21 and the fixing portion 22.

The two moving parts 21 may be formed of symmetrical structure and shape in both end portions of the suspension 20.

The moving portion 21 may be interposed between the first projection 13 of the first touch sensing member 11 and the second projection 14 of the second touch sensing member 12 and be supported or combined, and thus, the moving portion 21 may move together with the first and second touch sensing members 11, 12 in the same direction when the first touch sensing member 11 or the second touch sensing member 12 is touched.

Each moving portion 21 may be inserted and supported between the first cutting edge portion 13c of the first projection 13 and the second cutting edge portion 14c of the second projection 14. Thus, the top surface of each moving portion 21 may be pressed by the first projection 13, and the bottom surface of each moving portion 21 may be pressed by the second projection 14.

The first inclined surface 13b of the first projection 13 and the second inclined surface 14b of the second projection 14 may be formed symmetrically above and below, and the up and down movement of the moving portion 21 may be accomplished smoothly in response to the touch of the touch sensing members 11, 12 as the moving portion 21 of the suspension 20 is inserted and supported between the first cutting edge portion 13c of the first projection 13 and the second cutting edge portion 14c of the second projection 14.

The fixing portion 22 may be inserted and fixed into the fixing groove 42 of the frame 40. As shown in FIG. 13, the fixing portion 22 may be provided with a fastening portion 24 that can be fastened through the fastener with respect to the frame 40.

One or more fastening holes 24a may be formed in the edge of the fastening portion 24, and correspondingly, a fastening hole 40a may also be formed in the frame 40. Thus, the fixing portion 22 may be firmly fixed to the fixing groove 42 of the frame 40 as the fastener such as a screw is fastened to fastening the hole 24a of the fastening portion 24 and the fastening hole 40a of the frame 40. The width W3 of the fastening portion 24 may be formed to be larger than the width W2 of the fixing portion 22 and the deformation portion 23, and thus, the fixing portion 22 may be stably fixed to the fixing groove 42 of the frame 40.

The fixing portion 22 may be formed to be spaced apart from each moving portion 21 at regular distance S1, and the deformation portion 23 which is bent in response to the touch direction may be formed between the moving portion 21 and the fixing portion 22. Thus, the deformation portion 23 may be formed in a portion corresponding to the distance S1 between the moving portion 21 and the fixing portion 22.

According to one embodiment, the width W1 of the moving portion 21 may be formed to be larger than the width W2 of the fixing portion 22 and the deformation portion 23 (W1>W2), and thus, the cross-section of the moving portion 21 may become relatively larger to secure rigidity.

The frame 40 may be provided with a center portion 41 which fixes the fixing portion 22 of the suspension 20, and a border portion 45 which surrounds the center portion 41.

The center portion 41 may be provided with a plurality of ribs 43, and each rib 43 may be connected to the border portion 45. A plurality of fastening holes 40a may be formed in the center portion 41, and the plurality of fastening holes 40a may be formed corresponding to the fastening hole 24a of the suspension 20.

As shown in FIG. 14, the fixing groove 42 to which the fixing portion 22 is fixed may be formed in the center portion 41, and the thickness t1 of the center portion 41 may be formed thinner than the thickness t2 of the border portion 45.

In addition, the frame 40 may be provided with a mounting arm 49 which is mounted in a vehicle trim or the like. The mounting arm 49 may be configured to protrude to the outer side of the first touch sensing member 11 and the second touch sensing member 12, such that the mounting arm 49 may be combined detachably to a mounting hole 69 of a mounting surface 60.

An opening 19 may be formed in at least one of the first side wall 11c of the first touch sensing member 11 and the second side wall 12c of the second touch sensing member 12. FIG. 13 illustrates that the opening 19 is formed in the second side wall 12c of the second touch sensing member 12.

At least a pair of support ribs 16a supporting each moving portion 21 in the width direction may be formed in at least one of the first rear side 11b of the first touch sensing member 11, and the second rear side 12b of the second touch sensing member 12.

A pair of support ribs 16a may be connected by a reinforcing rib 16b.

According to the present disclosure, it is possible to easily recognize a touch for two touch surfaces located on the opposite side and implement a double-sided touch input structure effectively.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A touch input device comprising:
a first touch sensing member having a first touch surface and a first opposite surface opposite the first touch surface;
a second touch sensing member spaced from the first touch sensing member, the second touch sensing member having a second touch surface and a second opposite surface opposite the second touch surface, wherein the first opposite surface of the first touch sensing member is spaced from the second opposite surface of the second touch sensing member;
a suspension configured to be deformable in response to a touch direction when a touch is applied to the first touch sensing member or the second touch sensing member, wherein the suspension is disposed between the first opposite surface of the first touch sensing member and the second opposite surface of the second touch sensing member, the suspension having a suspension body that includes a moving portion configured to move first and second touch sensing members, a fixed portion configured to be fixedly attached to a frame, and a deformable portion between the moving portion and the fixed portion; and
a force sensor disposed in the suspension.

2. The touch input device of claim 1, wherein the suspension body is configured to be bent toward the second touch sensing member when the first touch sensing member is touched, and wherein the suspension body is configured to be bent toward the first touch sensing member when the second touch sensing member is touched.

3. The touch input device of claim 1, wherein the suspension comprises a plate spring.

4. The touch input device of claim 3, wherein the plate spring a length and a thickness, the length being longer than the thickness.

5. The touch input device of claim 1, wherein the moving portion of the suspension body is supported by the first and second touch sensing members, and the fixed portion of the suspension body is fixed to a frame.

6. The touch input device of claim 1, wherein the force sensor is configured to output a signal individually according to a bending direction of the suspension body.

7. The touch input device of claim 1, wherein the force sensor is provided adjacent the deformation portion of the suspension body.

8. The touch input device of claim 1, wherein the force sensor comprises a strain gauge.

9. The touch input device of claim 1, wherein the suspension comprises the suspension body, a first air gap and a second air gap, wherein the suspension body is separated from the first opposite surface of the first touch sensing member by the first air gap and is separated from the second opposite surface of the second touch sensing member by the second air gap.

10. A method of operating a touch input device that includes a first touch sensing member, a second touch sensing member, a suspension between the first touch sensing member and the second touch sensing member, and a force sensor disposed in the suspension, wherein the suspension has a suspension body that includes a moving portion, a fixed portion and a deformable portion between the moving portion and the fixed portion, the method comprising:
sensing a force due do a touching of the first touch sensing member, the force causing the moving portion of the suspension body to be moved toward the second touch sensing member and the deformable portion to be bent toward the second touch sensing member while the fixed portion is fixedly attached to a frame of the touch input device;

outputting an indication that the first touch sensing member has been touched;

sensing a force due do a touching of the second touch sensing member, the force causing the moving portion of the suspension body to be moved toward the first touch sensing member and the deformable portion to be bent toward the first touch sensing member while the fixed portion is fixedly attached to the frame; and outputting an indication that the second touch sensing member has been touched.

11. The method of claim 10, wherein outputting the indication that the first touch sensing member has been touched comprises outputting a signal from the force sensor.

12. A touch input device comprising:

a first touch sensing member having a first touch surface and a first opposite surface opposite the first touch surface;

a second touch sensing member spaced from the first touch sensing member, the second touch sensing member having a second touch surface and a second opposite surface opposite the second touch surface, wherein the first opposite surface of the first touch sensing member is spaced from the second opposite surface of the second touch sensing member;

a frame;

a suspension body configured to be deformable in response to a touch direction when a touch is applied to the first touch sensing member or the second touch sensing member, wherein the suspension body is separated from the first opposite surface of the first touch sensing member by a first air gap and separated from the second opposite surface of the second touch sensing member by a second air gap, wherein at least a portion of the suspension body is supported by the first and second touch sensing members, and another portion of the suspension body is fixed to the frame; and a force sensor disposed in the first air gap or the second air gap.

13. The touch input device of claim 12, wherein the suspension body is configured to be bent toward the second touch sensing member when the first touch sensing member is touched, and wherein the suspension body is configured to be bent toward the first touch sensing member when the second touch sensing member is touched.

14. The touch input device of claim 12, wherein the suspension body comprises a plate spring.

15. The touch input device of claim 12, wherein the force sensor is configured to output a signal individually according to a bending direction of the suspension body.

16. The touch input device of claim 12, wherein the suspension body includes a moving portion that moves by a selective touch for the first touch sensing member and the second touch sensing member, a fixing portion that is spaced apart from the moving portion at regular distance, and a deformation portion disposed between the moving portion and the fixing portion.

17. The touch input device of claim 16, wherein the force sensor is provided adjacent the deformation portion of the suspension body.

* * * * *